United States Patent [19]

Theall

[11] 4,375,051
[45] Feb. 22, 1983

[54] AUTOMATIC IMPEDANCE MATCHING BETWEEN SOURCE AND LOAD

[75] Inventor: C. Earle Theall, Weston, Conn.

[73] Assignee: The Perkin-Elmer Corporation, Norwalk, Conn.

[21] Appl. No.: 235,784

[22] Filed: Feb. 19, 1981

[51] Int. Cl.³ .............................................. H03H 7/40
[52] U.S. Cl. .................................. 333/17 M; 328/69
[58] Field of Search .......................... 333/17 R, 17 M; 455/116, 117, 123, 125, 126

[56] References Cited

U.S. PATENT DOCUMENTS

| | | | |
|---|---|---|---|
| 2,456,800 | 12/1948 | Taylor et al. | 333/17 M |
| 3,366,883 | 1/1968 | Griffin et al. | 455/116 X |
| 3,601,717 | 8/1971 | Kuecken | 333/17 M |
| 3,852,669 | 12/1974 | Bowman et al. | 455/117 |
| 4,015,223 | 3/1977 | Cheze | 333/17 M |
| 4,019,150 | 4/1977 | Lurey et al. | 455/126 X |
| 4,044,308 | 8/1977 | Stites et al. | 455/126 X |
| 4,122,400 | 10/1978 | Medendorp et al. | 455/117 X |
| 4,165,493 | 8/1979 | Harrington | 455/116 X |

Primary Examiner—Paul L. Gensler
Attorney, Agent, or Firm—S. A. Giarratana; E. T. Grimes; T. P. Murphy

[57] ABSTRACT

An R.F. generator for providing power to a load via a transmission line wherein load impedance is automatically matched to the surge impedance of the transmission to provide maximum transfer of energy from the generator to the load. Voltages representative of input power and reflected power are utilized to control a load match circuit to cause load impedance to equal transmission line impedance. Feedback loop means are also provided to maintain net load power at an externally commanded level.

17 Claims, 9 Drawing Figures

AUTOMATIC IMPEDANCE MATCHING BETWEEN SOURCE AND LOAD

BACKGROUND OF THE INVENTION

It has long been understood in the field of power transmissions from a power source to a load, efficient transfer of power is impeded by power reflection from the load back to the source. In such cases the load is prevented from receiving adequate power and the power source receives the blunt of reflected power which may be damaging to it.

One method to insure that the load receives adequate power is simply to increase source power so that the load by brute force receives adequate power. However, this method provides greater reflected power and exacerbates damage to the power source.

For efficient power transfer, it is important that the source work into a load that is substantially resistive, i.e., non-reactive, and at a resistance level convenient to power generation.

However, where power source and load are separated by any distance more than a few inches, and/or the load is complex or reactive, or it is resistive but substantially greater or smaller than the characteristic impedance of the system, the problem of power reflection must be taken into consideration. Thus, when R.F. power is transmitted to a load via a transmission line, it is highly desirable that the generator see an impedance equal or substantially equal to the characteristic impedance of the transmission line. In addition, the transmission line at the load end must see the same impedance.

A problem associated with impedance matching results when the impedance of the real load varies. This causes the matched condition to change to an unmatched condition resulting in power reflections which lowers actual power to the load from the required amount and possible damage to the power generator end of the system.

The present invention provides an R.F. generator which overcomes this problem.

BRIEF SUMMARY OF THE INVENTION

The present invention is a R.F. generator for supplying power to a load. It comprises an R.F. power source connected to deliver load power via a transmision line. Load match means are disposed between the power source and load for automatically matching apparent load impedance to the characteristic impedance of the transmission line such that the power source sees an apparent load of a fixed predetermined amount regardless of impedance variations in the real load. The load match means includes variable reactance means which are motor driven by a voltage representative of the difference between forward and reflected power until reflected power is reduced substantially to zero, thus insuring that power is efficiently transferred to the load.

The present invention further includes means for regulating R.F. power in accordance with an external command. The forward and reflected power are fed back to a summing amplifier having a third input representative of the command or power set level. The output of the summing amplifier is fed to a field effect transistor attenuator contained within the power source to control the voltage amplitude in accordance with the command voltage.

One use of the present invention is to supply ionizing power to gases in a dry process wafer etching system. In such a system, photoresist is removed from a photoresist coated silicon wafer in accordance with a pattern previously formed on the wafer by, e.g., exposing the wafer to light through a mask having patterns formed thereon.

In such a system power is applied to electrodes within a gas chamber to generate a plasma which etches the photoresist. In such a system where power and frequency are dictated by the particular gases used, power as high as three hundred watts at a predetermined frequency is applied to the electrodes from a remotely located power source via a relatively long transmission line. Accurate control of power and virtual elimination of reflected power to assure efficient transfer of precise values of power to the load are critical.

The R.F. generator of the present invention while having general utility, is ideally suited in dry etching systems and in one embodiment includes means for measuring the impedance of the etching gas in addition to providing accurately controlled power with automatic matching of load impedance to the surge impedance of the transmission line to virtually eliminate reflected power with its attendant disadvantages.

DESCRIPTION OF THE INVENTION

Figure 1:
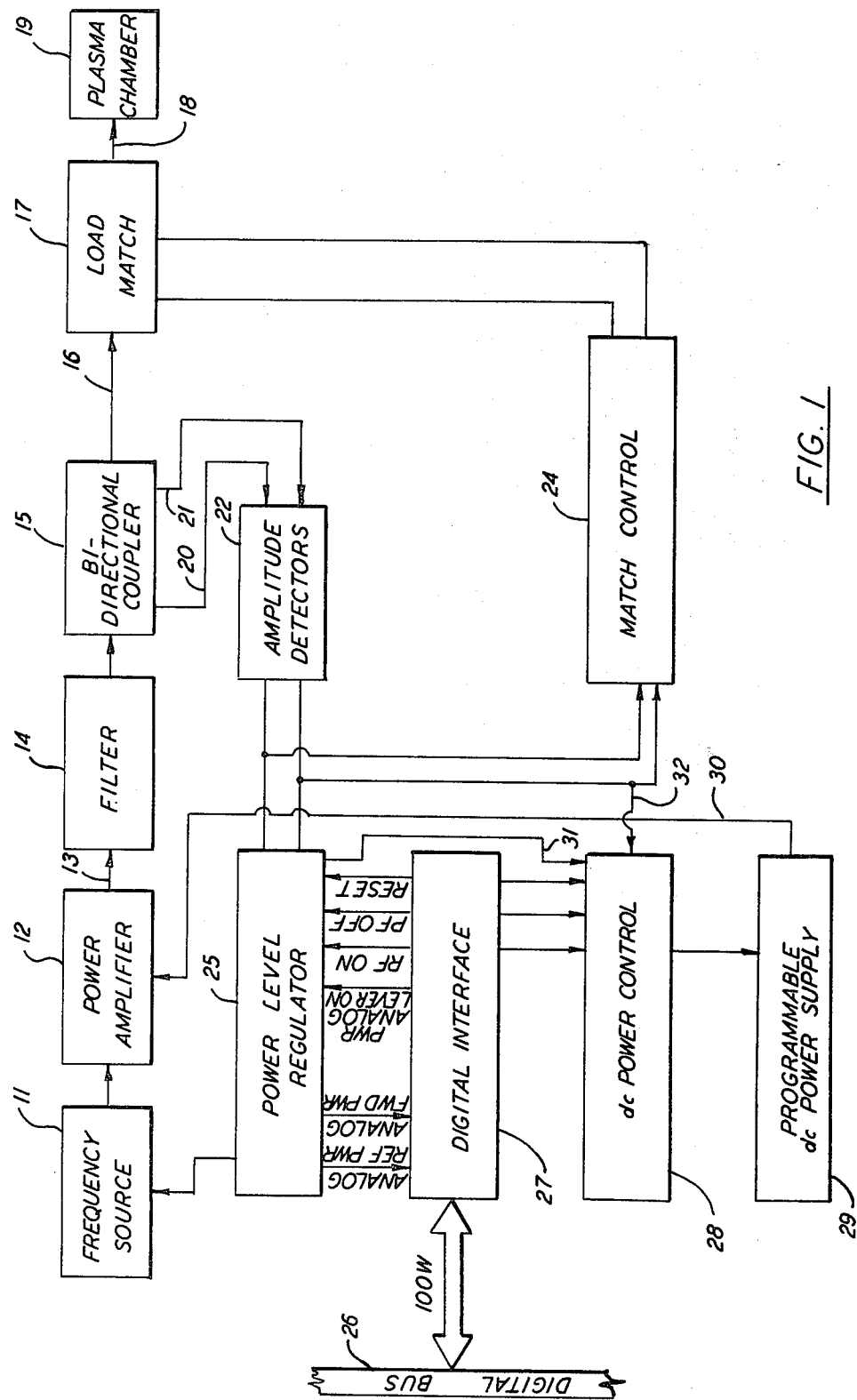
FIG. 1 is a block diagram of an embodiment of the present invention.

FIG. 1 shows the R.F. generator of the present invention in block diagram form. It comprises a source 11 of frequency. The source is a crystal oscillator connected to an R.F. preamplifier via a field effect transistor FET attenuator. As will be explained more fully hereinbelow, the FET attenuator is used to control the amplitude of the voltages provided at the input of the R.F. preamplifier. The crystal oscillator and R.F. preamplifier are standard state of the art items. An applicable oscillator is the CTS Knight's MX050; a preamplifier is exemplified by a Motorola MRF 427 transistor.

The output of the R.F. preamplifier is connected to power amplifier 12.

The power amplifier 12 is connected to a filter circuit 14 via a transmission line transformer which is part of the output circuit of the power amplifier 12 and connector 13. This transformer transforms the low output impedance of the power amplifier transistors to the standard impedance of the filter 14. The filter circuit 14 functions to remove harmonic distortion from the output waveform of the power amplifier 12 and provide some minimum load to the power amplifier 12. The filter circuit is configured as a low pass filter which arrangement blocks harmonic frequencies; the filter's component values are particularly chosen to give it a more constant input impedance magnitude for extremes in load magnitude.

The output of the filter 14 is connected to bi-directional coupler 15. A transmission line 16 connects bi-directional coupler 15 to a load match circuit 17 which in turn is connected via transmission line 18 to a load, e.g., the load presented by a plasma etching chamber 19.

The transmission line 16 transmits R.F. power to a place proximate to the load where the load match circuit 17 transforms the load impedance, e.g., a variable plasma chamber impedance, to an impedance at the input of the load match 17 which matches the impedance of the transmission line 16, i.e., load impedance is matched to the surge impedance of the transmission line 20 to virtually eliminate reflected power back through the transmission line 16 back to the power source.

As is explained more fully hereinafter with reference to FIG. 3, the load match circuit 17 includes motor variable means for changing the load transmission line 16 sees to accommodate for changes in load impedance and eliminate resultant reflected power.

The bi-directional coupler 15 which is explained more fully hereinbelow has two output terminals 20 and 21 which provide output voltages proportional to forward power and reflected power, respectively.

Terminals 20 and 21 are connected to amplitude detectors 22. Amplitude detectors 22 sense the amplitudes of the a.c. voltages representative of forward and reflected power, converts each to d.c. and provides the d.c. voltages representative of forward and reflected power to match control circuit 24.

Figure 4:
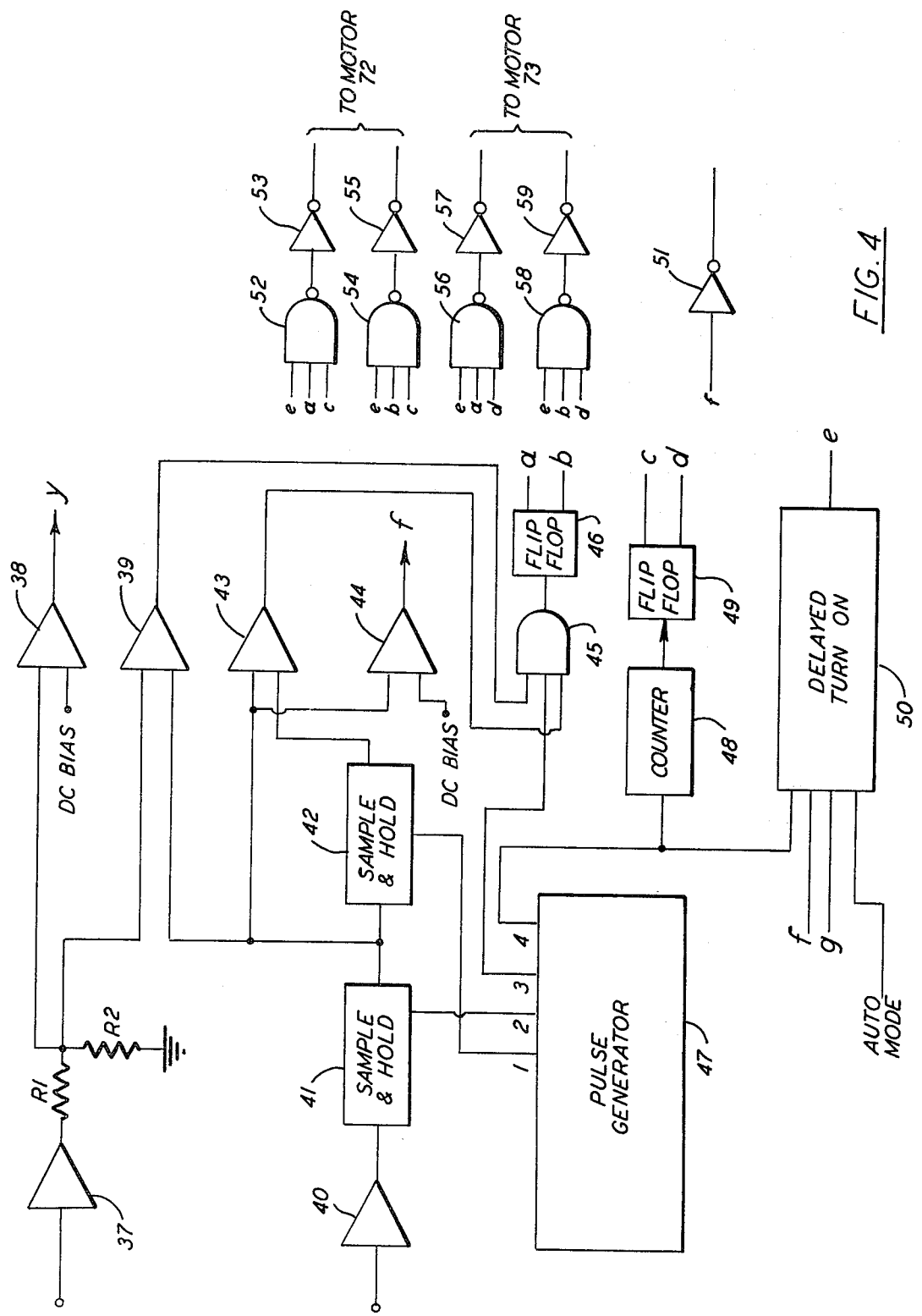
FIG. 4 is a representation showing circuit details of the match control circuit of FIG. 1.

The match control circuit 24 which is explained more fully in reference to FIG. 4 receives the voltages from bi-directional coupler 15 via amplitude detectors 22 proportional to the amount of forward and reflected power. Then, through a series of comparator circuits and associated logic energize the motors to move the capacitors in the load match 17, and in amounts and direction to cause reflected power to be eliminated or substantially reduced to zero.

The output of reflected and forward voltage from the amplitude detectors 22 are also connected to power level regulator circuit 25. These output voltages, which, as aforesaid, have been converted to d.c., are squared in the R.F. power level regulator 25 and then, with a voltage representative of power set level, are applied to a summing amplifier whose output is connected to the gate of a field effect transistor (FET) attenuator which controls the amplitude of the voltage output from the crystal oscillator in the frequency source 11. The portion of the system which includes output terminals 20 and 21 from bi-directional coupler 15, amplitude detector circuit 22, power level regulator 25, the summing amplifer and the FET attenuator constitutes a negative feedback loop. By this arrangement the net load power is maintained at the command or power set level.

In a practical embodiment of the present invention, the power set level is provided externally in digital form from a computer via digital bus 26 to digital interface 27 where it is converted by means of a standard D to A converter to analog form before application to the summing amplifier previously mentioned.

For purposes of system monitoring the forward and reflected power by the computer, the voltages representative of these values may be provided to the computer via amplitude detectors 22 to power level regulator 25 and thence to digital interface 27 where the voltages are converted from analog to digital form in an A to D converter and sent to the computer via digital bus 26.

The three most significant bits of the digital input representative of the power set level are provided as inputs to d.c. power control 28 where the particular binary value of the input selects a resistance from a resistance tree within d.c. power control 28 for insertion in the programming line of d.c. power supply 29. Thus, the d.c. voltage supplied to power amplifier 12 via conductor 30 by the programmable d.c. power supply 29 is automatically kept at the level required instead of continuously supplying full d.c. voltage to the amplifier 12. This protective feature provides greater efficiency in the use of power and lengthens the life of power amplifier 12.

In a practical embodiment the three bit input is connected to a three to eight converter. The three bit input causes none or a selected one of the eight outputs of the three to eight converter to be energized in accordance with the value represented by the three bits. The three to eight converter is connected to a resistance tree which, depending on the one of the eight outputs selected, connects an appropriate resistance in the resistance tree to control the particular value of d.c. voltage reaching the power amplifier 12.

The R.F. power level regulator 25 also includes a sequencing circuit so that when R.F. power is first turned on and before the full amount of power is commanded, a low level of R.F. power is provided by means of a control signal to d.c. power control circuit 28 via conductor 31. Thus, when a reasonable impedance match is effected by load match circuit 17 as indicated by the voltage representative of reflected power applied to d.c. power control circuit 28 from amplitude detectors 22 on conductor 32, control is switched to the power set control on digital bus 26.

If the amount of power reflected is so large as to be potentially damaging, the voltage representative of reflected power from amplitude detectors 22 causes the d.c. control circuit 28 to effect a low, safe value of control voltage from programmable d.c. power supply 29 to power amplifier 12 until reflected power is reduced to a safe amount by load match circuit 17.

What has thus far been described is the overall system by which the present invention functions to automatically match load impedance to a standard input impedance to eliminate or substantially reduce reflected power with its attendant disadvantages of component damage and power waste. Further, there has been described a feedback arrangement which in combination with input commands maintains the net power supplied to the load at the required power set level.

Hereinafter are discussed details of certain ones of the elements of this invention which are necessary for a complete understanding of the invention.

The bi-directional coupler 15 is a conventional commercial item whose circuit parameters depend on the frequency of the R.F. generator. In a practical embodiment, one such frequency is 13.56 MHZ. For such a frequency an appropriate bi-directional coupler is the ANZAC CH-130-4. If as in another practical embodiment the frequency is 100 KHZ, then an appropriate bi-directional coupler is the MERRIMAC CRN-30-.345/27151.

The bi-directional coupler 15 functions to separate components of forward and reflected power from the power line. These are so small as to be virtually without effect on power delivered to the load.

All the ports of bi-directional coupler have the same resistance e.g., 50 ohms. This is the resistance which the load sees through the match load circuit 17 at the output of transmission line 16 and is the standard to which apparent load impedance is matched.

The terminals 20 and 21 provide the voltages proportional to the forward and reflected power to amplitude detectors 22.

Each of the voltages representative of forward and reflected power are provided as an input to an amplitude detector in amplitude detector circuit 22. One of these amplitude detectors is shown in FIG. 2, it being understood that the other amplitude detector is identical to the one shown.

Figure 2:
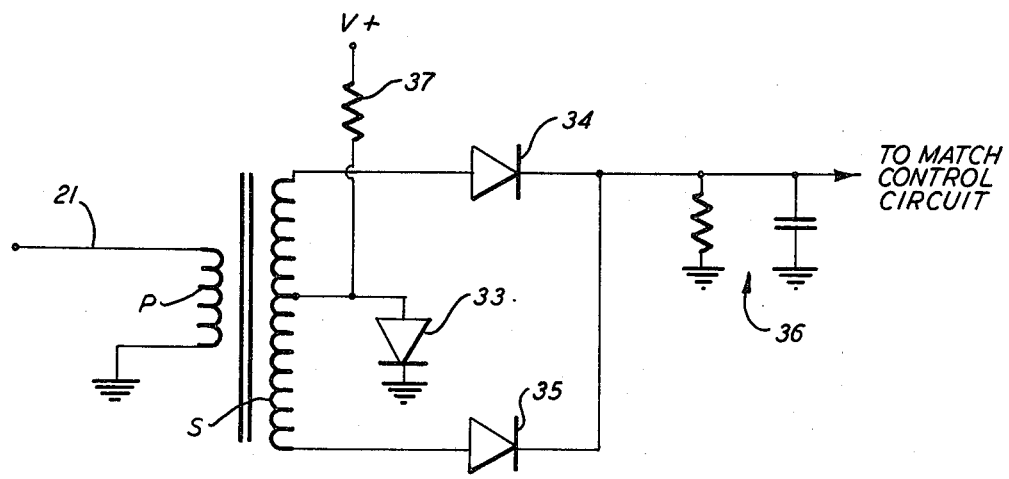
FIG. 2 is a schematic representation showing circuit details of the amplitude detectors of FIG. 1.

The amplitude detector of FIG. 2 is a full wave rectifier and comprises a primary winding P and a secondary winding S. The secondary winding is tapped at its midpoint and connected to ground via a rectifier 33. Each end of secondary S is connected to a diode 34 and 35. The output of diode 35 is connected to the output of diode 34. A filter circuit 36 made up of a resistor and capacitor are individually connected between the junction of diodes 34 and 35 and ground as shown.

The filter circuit 36 functions in a conventional manner to smooth the positive full wave rectified pulses. The midpoint connection is also connected to a voltage V+ via a resistance 37. The V+ functions to maintain diode 33 always on, thereby prebiasing diodes 34 and 35 to insure that diodes 34 and 35 pass voltage from zero volts upwards. Without this arrangement diodes 34 and 35 would not turn on until the input voltage reached a level determined by the inherent characteristic of the diodes 34 and 35.

The rectified voltage from each one of the two amplitude detectors is provided as an input to match control circuit 24 whose outputs control the motors in load match circuit 17 to vary the capacitors therein until apparent load equals input impedance.

Figure 3:
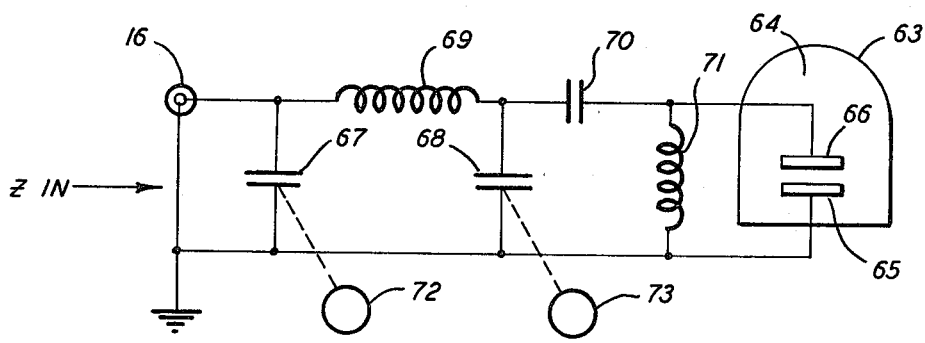
FIG. 3 is a schematic representation showing circuit details of the load match circuit of FIG. 1.

FIG. 3 shows the circuit details of the load match circuit 17. The R.F. Generator of the present invention may be used with any load whose impedance varies thus requiring an adjustable load match capability. However, a practical embodiment of the load to which the R.F. generator is matched is a plasma chamber 63 used for etching photoresist coatings on silicon wafers. Briefly, the plasma chamber comprises a chamber 64 evacuated except for the etching gases normally passed therethrough. Within the chamber are two electrodes 65 and 66. The wafer rests on electrode 65. The electrode 65 is grounded and R.F. power in an amount and at a frequency determined by the nature of the etching required and etching gases used is applied to the electrode 66. This causes the gas to become ionized and perform the etching function.

To obtain the appropriate impedance match the load match circuit 17 is interposed between the load and the power source via transmission line 16.

A variable capacitor 67 is connected between transmission line 16 and ground. A second variable capacitor 68 is similarly connected and an inductance 69 is connected between the ungrounded ends of the capacitors 67 and 68. The inductance 69 is connected to one side of a capacitor 70 whose other side is connected to one end of inductance 71. The other end of the inductance 71 is connected to ground. The values of the above described components are selected in accordance with the value of the load.

In a practical embodiment the load varies between approximately 60 and 600 ohms and Zin is 50 ohms. Therefore, the apparent resistance of the load should be at or substantially at 50 ohms for a match. In such an embodiment the R.F. Power may vary between 50 and 300 watts at a frequency of 13.56 MHZ. With this arrangement typical values of variable capacitors 67 and 68 and the value of inductance 69, for different load $R_L$ values would be:

| Zin | RL | C67 | C68 | L69 |
|---|---|---|---|---|
| 50 ohms | 50 ohms | 256 pfd | 145 pfd | .585 μhy |
| " | 100 ohms | 472 pfd | 354 pfd | " |
| " | 200 ohms | 644 pfd | 338 pfd | " |
| " | 300 ohms | 763 pfd | 324 pfd | " |
| " | 500 ohms | 943 pfd | 306 pfd | " |

Capacitor 70 have a value of 5000 pfd and inductance 71 has a value of 0.459μ hy which tunes out the load capacitance so that the equivalent load is only resistive, RL .i.e. load 63 appears resistive.

Capacitors 67 and 68, which are variable in either direction, are connected to reversible stepping motors 72 and 73. As previously described in connection with FIG. 1 when there is reflected power, the capacitors are varied until the reflected power is reduced substantially to zero, thus providing an impedance match, i.e., Zin sees an apparent resistance equal to itself. By virtue of the motors 72 and 73, the bi-directional coupler 15, the amplitude detectors 22 and the match control circuit 24, impedance matching is continuous (as the load varies) and automatic.

Referring to FIG. 4 there is shown the details of the match control circuit 24 which functions to drive the motors 72 and 73 and their associated variable capacitances 67 and 68 in load match circuit 19.

Amplifier 37 receives an input from the amplitude detector of amplitude detectors 22 providing a voltage representative of the forward power. The output of amplifier 37 is connected as an input to comparator circuit 38. The comparator circuit 38 has a second input in the form of an d.c. bias which is a small threshold voltage. When forward voltage is present and is above the threshold, comparator circuit 38 provides an output g.

The output of amplifier 37 is also provided as one input to comparator circuit 39 via a voltage divider $R_1$ and $R_2$. The ratio of resistances $R_1$ and $R_2$ are chosen so that the voltage provided to comparator circuit 39 is a predetermined fraction, e.g., one-half of the voltage representative of the forward power and is the $Y_2$ threshold shown is FIG. 6.

Amplifier 40 receives an input from the amplitude detector of amplitude detectors 22 which is the voltage representative of the reflected power. The output of amplifier 40 is provided as an input to sample and hold circuit 41.

The output terminal of sample and hold circuit 41 is connected to provide inputs to sample and hold circuit 42, to comparator circuit 39 as well as to comparator circuits 43 and 44.

The output terminal of sample and hold circuit 42 is connected to provide an input to comparator circuit 43.

Figure 6:
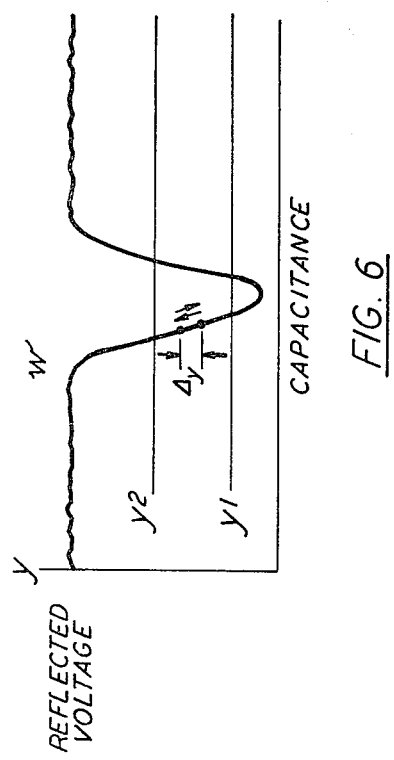
FIG. 6 is a graph of reflected voltage versus capacitance useful in explaining the operation of the match control circuit of FIG. 5.

The comparator circuit 44 has a d.c. bias input of such a level that comparator circuit 44 provides an output f when the voltage output of sample and hold circuit 41 exceeds this d.c. bias value which is threshold $Y_1$ as shown in FIG. 6.

Each of comparators 39 and 43 provide an input to AND circuit 45 whose output is connected to flip-flip 46.

Figure 7:
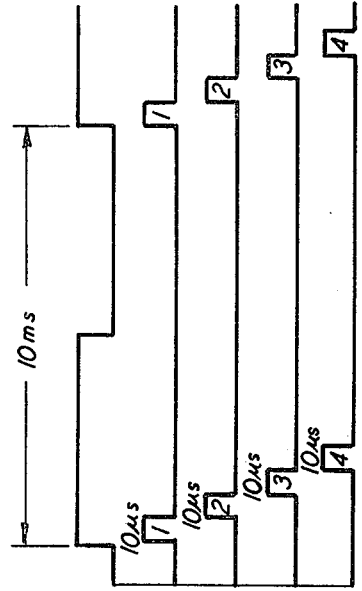
FIG. 7 is a timing diagram useful in explaining the operation of the match control circuit of FIG. 5.

A pulse generator 47 which is of a conventional type comprised of several Texas Instruments 74123 multivibrators provides in a cyclic fashion output pulses 1, 2, 3 and 4 as represented in FIG. 7. As seen from FIG. 7 each of these pulses occur periodically, i.e., every 10 ms and each pulse is of 10 $\mu$s in duration.

Pulse 1 provides an input to sample and hold circuit 42 and each time it occurs the voltage held in sample and hold circuit 41 is transferred and held in sample and hold circuit 42 where it serves as an input to comparator circuit 43.

Pulse 2 is provided as an input to sample and hold circuit 41 and each time it occurs the voltage representative of reflected power on the output of amplifier 40 is transferred and held in sample and hold circuit 41 where it serves as inputs to comparator circuit 39, 43 and 44.

Pulse 3 is provided as the third input to AND circuit 45. When all three inputs to AND circuit occur in coincidence, flip-flop 46 changes states and each change in state causes motors 72 or 73 to reverse as will be more fully explained hereinbelow.

Pulse 4 provides an input to counter 48 and to delayed turn on circuit 50. The counter 48 is connected to flip-flop 49 and each time counter 48 counts 16 occurrences of pulse 4, the flip-flop 49 is caused to change states. The particular state of the flip-flop 49 is determinative of which of the two motors 72 or 73 in load match circuit 17 is energized.

The delayed turn on circuit 50 is also connected to receive inputs from comparator circuits 38 and 44. Delayed turn on circuit 50 has a fourth input terminal from which it receives a signal when the system is in the automatic mode, e.g., when a switch is turned on. When all four input terminals to delayed turn on circuit 50 have a signal or are "high", an output signal e is provided after a short delay as will be seen later in reference to FIG. 5. This signal e provides motor drive pulses to each of the motors.

The output f of comparator circuit 44 is connected to amplifier 51 and when signal f is present amplifier 51 supplies the required d.c. power to the motors 72 and 73 in the load match circuit 17.

The outputs from motor reversing flip-flop 46 are labeled a and b and the outputs from motor selecting flip-flop 49 are labeled c and d.

AND gates 52, 54, 56 and 58 whose outputs are connected to amplifiers 53, 55, 57 and 59 respectively, all receive inputs from delayed turn on circuit 50. Thus input e is periodic with the occurrence of pulse 4 and has a duration equal to the duration of pulse 4. It should be noted that pulse e is the drive pulse to the stepping motor 72 or 73 selected by flip-flop 49 in a direction determined by flip-flop 46.

AND gate 52 also has inputs from the a output of flip-flop 46 and the c output of flip-flop 49.

AND gate 54 has inputs also has inputs from the b output of flip-flop 46 and the c output from flip-flop 49.

AND gate 56 also has inputs from the a output of flip-flop 46 and the d output from flip-flop 49.

AND gate 58 also has inputs from the b output of flip-flop 46 and the d output from flip-flop 49.

Figure 5:
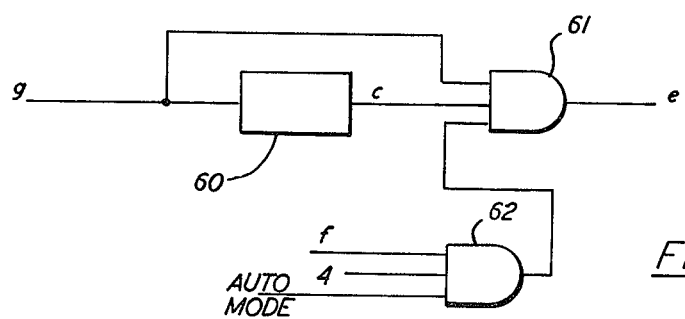
FIG. 5 is a representation showing circuit details of the delay turn on circuit of FIG. 5.

FIG. 5 shows the details of the delayed turn on circuit 50 of FIG. 4. It comprises a one-shot multivibrator 60 whose input is connected to the output comparator circuit 38 which also provides an input to AND gate 61. The output terminal of the one-shot multivibrator 60 also provides an input to AND gate 61 which receives its third input from AND gate 62.

The AND gate 62 receives three inputs—one from the output of comparator circuit 44, one from pulse 4 of the pulse generator 47 and one when the system is in the automatic mode.

Thus, when comparator 44 has an output f, i.e., when its input from sample and hold circuit 41 is greater than the predetermined d.c. bias input representative of the $y_1$ threshold of FIG. 6, and when the system is in the automatic mode, AND gate 62 provides an output pulse to AND gate 61 for the duration of each pulse 4 from pulse generator 47. When comparator circuit 38 has an output g, i.e., when there is forward power in the line, and AND gate 61 has an input from AND gate 62, the pulse e is provided to each of the AND gates 52, 54, 56 and 58. The one-shot multivibrator 60 whose output is normally positive, i.e., high, goes negative for a time after the occurrence of the signal g thus preventing the appearance of the signal e for a time, i.e., the delay of one-shot multivibrator 60 delayed c signal. This delay insures that the plasma is on, with impedance stabilized, before the match motors are allowed to start. From then on while signals g and f are present and the system is in the automatic mode, pulse e occurs each time pulse 4 occurs.

The outputs of amplifiers 53 and 55 of the match control circuit of FIG. 4 are connected to motor 72. In a similar manner the outputs of amplifiers 57 and 59 are connected to motor 73.

FIG. 6 is a graph of reflected voltage vs capacitance which is the capacitance of variable capacitors 67 and 68. The waveform w depicted in FIG. 6 is representative of reflected voltage and therefore reflected power from the load.

$Y_2$ is a voltage of a value which represents an upper threshold of reflected power. As previously explained in reference to FIG. 4, this voltage which is provided as an input to comparator circuit 39 is a percentage of the voltage representative of forward power. The voltage $y_2$ is continuously compared with the voltage in sample and hold circuit 41 which varies with changes in reflected voltage on each occurrence of pulse 2 from pulse generator 47. As long as reflected voltage from sample and hold circuit 41 is higher than $y_2$, comparator circuit 39 has a low output and regardless of other conditions AND circuit 45 cannot change the state of motor reversing flip-flop 46. Therefore, the motor 72 or 73 alternately selected by flip-flop 49 is driven in the same direction until the output from sample and hold circuit 41 becomes less than $y_2$. At this point reflected voltage as shown in the graph of FIG. 6 is between threshold voltages $y_2$ and $y_1$.

In this condition the output from comparator circuit 39 is high and if the output from comparator circuit 43 is high, AND gate 45 causes motor reversing flip-flop 46 to change states on the next occurrence of pulse 3 from the pulse generator 47. However, the output of comparator circuit 43 produces a high to cause the motors 72 and 73 to reverse directions only if the voltage held by sample and hold circuit 42 which is an input to comparator circuit 43 is less than the voltage from sample and hold circuit 41. This condition means the new level of reflected voltage in sample and hold circuit 41 is higher than the old level in sample and hold circuit 42 and the motors 72 and 73 are being driven in the wrong direction, Thus, the state of flip-flop 46 is caused to change, thus reversing directions.

However, if the voltage held in sample and hold circuit 42 is greater than that in sample and hold circuit 41, this means the motors 72 and 73 and their respective capacitors 67 and 68 are moving in the right direction, i.e., decreasing reflected voltage and comparator circuit 43 has a low output and flip-flop 46 will not be caused to change states.

However, if the initial condition is that reflected voltage is greater than $y_1$ the motors as aforesaid continue in the same direction which is the correct direction since reflected voltage is constantly being decreased. For this condition, voltage held in sample and hold circuit 42 is greater than that in sample and hold circuit 41 and the output from comparator circuit 43 remains low and no motor reversing change of state takes place by flip-flop 46. The capacitors are driven until reflected voltage becomes less than threshold voltage $y_1$ which indicates that reflected voltage has reached an acceptable substantially zero value. At this point, the output from comparator circuit 44 goes low because the new voltage held in sample and hold circuit 41 is less than the d.c. bias $y_1$ which is the threshold below which the motors 72 and 73 can be deenergized. When this occurs, the output f from comparator circuit 44 goes low and d.c. power to the stepping motors 72 and 73 from amplifier is stopped. In addition, since f is low, the motor pulsing signal e stops.

On the other hand, if the initial turn on condition of the system finds the reflected voltage between thresholds $y_2$ and $y_1$, a problem exists in that the direction of motor travel may be incorrect.

The present invention overcomes this problem by means of comparator circuit 43 whose output is connected to AND gate 45. Thus, if motors 72 and 73 are being driven in the wrong direction, i.e., in the direction of increasing reflected power, the outputs of sample and hold circuits 41 and 42 are compared in comparator circuit 43. If the output from sample and hold circuit 41 is greater than that of sample and hold circuit 42, reflected voltage is increasing and AND circuit 45 receives a high from comparator circuit 43 and since comparator circuit 39 is also high because its input from sample and hold circuit 41 is necessarily lower than its input from amplifier 37, the state of motor reversing flip-flop 46 is changed and the direction of motors 72 and 73 change to cause capacitors 67 and 68 to begin reducing reflected voltage until reflected voltage falls below threshold $y_1$. As previously explained when this happens, the output f from comparator circuit goes low and the motors 72 and 73 are deenergized.

Of course, if at the initial condition when reflected voltage is between $y_1$ and $y_2$ and the motors happen to be going in the right direction, i.e., the voltage held by sample and hold circuit 41 is less than that held by sample and hold circuit 42, the output from comparator 43 is low because the motors 72 and 73 are going in the direction of decreasing voltage and flip-flop 45 does not change state because no motor reversal is required. Thus, motor rotation continues in the same direction until threshold $y_1$ is reached by the reflected voltage and the motors are deenergized.

Naturally, if impedance of the load changes, reflected voltage may rise above $y_1$ or even $y_2$ and the process described above again becomes operative until reflected voltage is again forced below threshold $y_1$.

It can be seen from FIG. 4 that motor 72 is driven by amplifiers 53 or 55. For example, if the inputs e, a and c are present at AND circuit 52, motor 72 is stepped in one direction at each pulse e and in the opposite direction on the occurrence of e, b, c at AND gate 54.

Likewise, motor 73 is stepped in said one direction when inputs e, a and d are present at AND gate 56 and in the opposite direction when inputs e, b and d are present at AND gate 58.

Sample and hold circuits 41 and 42 are updated each time pulse 2 and pulse 1 occurs, respectively.

Motor directions are reversed, if the prerequisite conditions exist, on occurrence of pulse 3. Motors 72 and 73 are changed, i.e., selected after pulse 4 has occurred 16 times as kept track by counter 48.

Motors are stepped only during the existence of pulse e which exists only for the duration of each pulse 4.

Thus, has been described the circuitry for automatically matching load impedance to the input impedance the load sees in a dynamic system.

Figure 8:
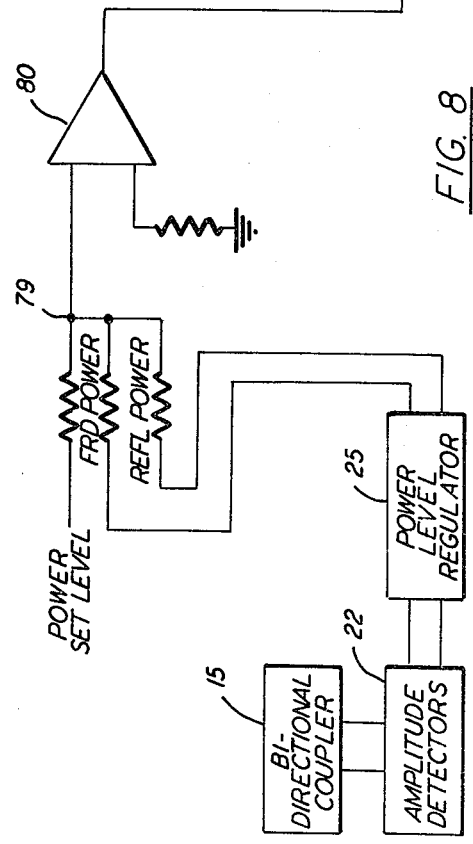
FIG. 8 is schematic representation showing circuit details of the feedback circuit for controlling R.F. Power to the load shown in FIG. 1.

Referring to FIG. 8 there is shown the feedback circuit for maintaining R.F. power to the load at the externally commanded power set level.

It comprises amplifier 80 having an input from summing terminal 79 and an output to field effect transistor 81 whose two output terminals are connected to oscillator 82 and preamplifier 83 which form frequency source 11. The output of preamplifier 83 is connected to power amplifier 12.

The external power set level, i.e., desired R.F. power to the load serves as one input to summing junction 79.

The amplitude detectors 22 voltage provide inputs proportional to forward and reflected power to power level regulator 25 where the voltages are squared making them a function of power. In addition, the voltage representative of forward power is inverted.

Both of these voltages are fed to junction point 79. When R.F. power is on and there is no reflected power and forward power equals the power set level no feedback adjustment is required. However, if forward power from bi-directional coupler 15 is more or less than that commanded, the forward power coupled to summing junction 79 proportionately reduces or increases, respectively, the amount of set level voltage into amplifier 80 and then to FET 81. If simultaneously there is some reflected power, voltage at summing junction 79 is accordingly adjusted upward to effectively increase R.F. power to the load to compensate for that lost in reflected power.

The foregoing is accomplished by FET 81 which serves as a resistance connection between oscillator 28 and preamplifier 83. The resistance of FET 81 can vary between the extremes of open circuit and short circuit. Thus, when the output from amplifier 80 calls for more power, the resistance of FET 81 is lowered and when less power is called for the resistance of FET 81 is raised accordingly.

Figure 9:
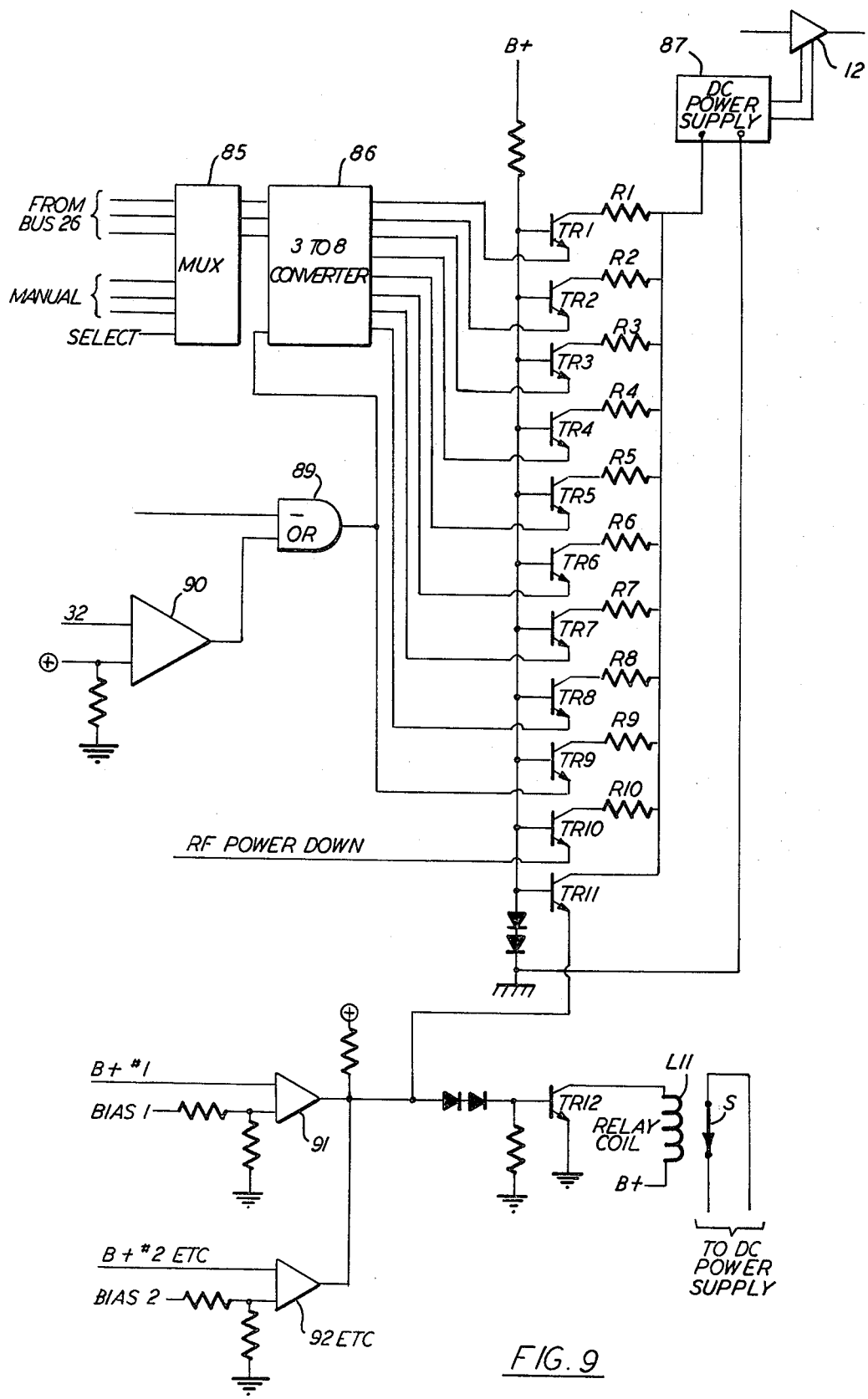
FIG. 9 is a schematic representation showing details of the d.c. power control and programmable d.c. power supply of FIG. 1.

FIG. 9 illustrates the arrangement for controlling d.c. voltage to power amplifier 12 as shown.

It comprises a multiplexer 85 which has digital inputs from digital bus 26 or from a manual control (not shown). Multiplexer 85 also has an input capable of selecting between the two sets of inputs. While full digital command power set level and the manual control each comprise a twelve bit word, use of the three most significant bits is adequate for power control of power amplifier 12. Multiplexer provides these three bits to 3 to 8 converter 86. The 3 to 8 converter takes the value of its three bit input which is capable of eight specific items of information and selects one of its eight lines to go low. Each of these lines is connected to a respective one of transistors $T_{R1}$ to $T_{R8}$ of a resistance tree. When one of the lines which are normally high goes low as determined by the three bit input to 3 to 8 converter 86, its associated transistor is turned on.

Each transistor $T_{R1}$ to $T_{R8}$ has resistance $R_1$ to $R_8$ connected to its collector which is connnected to the d.c. power supply 87. The d.c. power supply is also connected to the ground side of the B+ source which is connected to each of the bases of transistors $T_{R1}$ to $T_{R8}$. The resistances $R_1$ to $R_8$ themselves are of different values. When a selected resistance is placed in circuit within d.c. power supply between the power source and power amplifier 12, d.c. voltage to power amplifier 12 is changed in accordance with its need as called for by the three most significant bits.

For example, if the three most significant bits cause 3 to 8 converter to select output line 1, transistor $T_{R1}$ is energized and places resistance $R_1$ in the programming input of the d.c. power source. The amount of energizing voltage reaching power amplifier 12 is a function of the value of the resistance $R_1$. For different values of the three selecting bits, different ones of the eight transistors $T_{R1}$-$T_{R8}$ are energized placing the appropriately chosen resistance $R_1$ to $R_8$ in the circuit. For the lines 1 to 8, their associated resistance depend on the value of the three significant bits with increasingly greater resistances being put in the programming line with increasing power demand.

FIG. 9 also shows a negative OR gate 89. A negative OR gate is one that produces a low output when either one or both of its inputs is low. If both of its inputs are high, its output is high.

Therefore, when the output of OR gate 89 is low, it disables the 3 to 8 converter and turns on transistor $T_{R9}$ which places a small resistance $R_9$ in the power supply program input to provide a low, safe value of d.c. supply voltage thereto.

Terminal 32 provides a voltage input to the negative side of comparator circuit 90 proportional to reflected power. The other input to comparator circuit 90 is a threshold voltage representative of a predetermined reflected power any value above which may be damaging to the circuit. Thus, when voltage on terminal 32 is above the bias voltage, the output of comparator circuit 90 is low and therefore, the output from OR gate 89 is low. This disables the 3 to 8 converter and enables transistor $T_{R9}$ to place a small resistance at the d.c. power supply program input to thereby greatly reduce forward power and, thus, the potentially damaging reflected power.

The same protective feature is put into effect when the ratio of forward power to reflected power is too low. This information is provided as an input to OR gate 89 as a low to cause the output of OR gate 89 to be low disabling the 3 to 8 converter and turning on transistor $T_{R9}$.

When the ratio of forward power to reflected power is acceptable and when reflected power is below the previous mentioned threshold, OR gate 89 has two highs as inputs and, therefore, a high output which enables 3 to 8 converter 86 and turns off transistor $T_{R9}$ taking resistance $R_9$ out of circuit. The normal control of d.c. voltage to power amplifier 12 is then given back to 3 to 8 converter 86 and the transistors $T_{R1}$ to $T_{R8}$.

FIG. 9 also shows means for placing a small resistance $R_{10}$ in circuit if RF power fails. This places a low on the emitter of transistor $T_{R10}$ and puts $R_{10}$ in circuit drastically reducing d.c. voltage to power amplifier 12.

A comparator circuit 91 has a B+ input and a bias input. The B+ is taken from an auxilliary power source for supplying power to the various components. The output of comparator circuit 91 is connected to the collector of transistor $T_{R11}$ and to the base of transistor $T_{R12}$. Comparator circuit 92 has a different B+ input and a bias input peculiar thereto. The output of comparator circuit 92 is connected to the collector of transistor $T_{R11}$ and to the base of transistor $T_{R12}$.

There may be other comparator circuits like comparator circuits 91 or 92 each associated with a particular line of components requiring differing values of B+ and each having a different bias or tolerance below which its particular B+ value should not fall.

Transistor $T_{R12}$ is connected to ground via relay coil $L_{11}$ which normally holds switch S in the closed condition connecting power to power amplifier 12. When an auxilliary power supply B+ falls below its tolerance, e.g., bias 1 or bias 2 comparator circuits 91 or 92 and other similar comparator circuits (not shown) transistor $T_{R11}$ is made to conduct lowering the output supply voltage of d.c. power supply 87. At the same time transistor $T_{R12}$ is made non-conducting which deenergizes relay coil $L_{11}$ and opens switch S to interrupt power to power amplifier 12.

Other modifications of the present invention are possible in light of the above description which should not be construed as placing limitations on the invention beyond those set forth in the claims which follow:

What is claimed is:

1. A system for supplying R.F. power to a load, comprising;
   R.F. power source means,
   load match circuit means connected between said R.F. power source means and the load,
   said load match circuit means comprising;
   first and second variable capacitors together with an inductance forming a tank circuit and first and second reversible stepping motors connected to said first and second variable capacitors, respectively, for varying the capacitance of each;
   bi-directional coupler means connected between said R.F. power source means and said load match circuit means for providing voltage outputs proportional to forward and reflected power;
   control circuit means connected to receive said outputs from said bi-directional coupler means proportional to forward and reflected power and connected to said load match circuit means for energizing said first and second motors to vary said first and second capacitors to cause apparent load impedance to automatically match the surge impedance of said transmission line means to reduce reflected power substantially to zero regardless of variations of load impedance,
   said control circuit means comprising;
     first circuit means connected to said first motor for driving said first motor in a first or second direction, second circuit means connected to said second motor for driving said second motor in a first or second direction, first logic circuit means connected to said first and second circuit means for driving said first and second motors only in a direction for reducing the voltage from said bi-directional coupler means proportional to said reflected power, second logic circuit means connected to said first and second circuit means for periodically selecting one of said first and second motors to be energized, a pulse generator providing first, second, third and fourth pulses periodically, said second logic circuit comprising,
- a first flip-flop connected to said first and second circuit means,
- counter means connected between said generator means and said first flip-flop causing said first flip-flop to change states after said fourth pulse has occurred a predetermined number of times for selecting said first or second motors to be energized in accordance with the state of said first flip-flop.

2. A system according to claim 1 wherein said first logic means comprises first sample and hold circuit connected to said bi-directional coupler means and to said pulse generator means for receiving and holding said voltage porportional to reflected power on each occurrence of pulse two,
- second sample and hold circuit connected to said first sample and hold circuit and said pulse generator for receiving and storing said voltage proportional to reflected power on each occurrence of pulse one,
- a first comparator circuit connected to said first and second sample and hold circuits providing a high output only when voltage held in said first sample and hold circuit is lower than the voltage held in said second sample and hold circuit,
- a second comparator circuit connected to said first sample and hold circuit,
- voltage divider means connected between said bi-directional coupler means and said second comparator circuit providing a voltage to said second comparator circuit equal to a predetermined percentage of the voltage proportional to forward power, said second comparator having a high only when said voltage from said first sample and hold circuit is less then said voltage from said divider circuit means,
- an AND gate connected to receive the outputs from said first and second comparator circuit and to said pulse generator providing an output each time the third pulse occurs only if the outputs from said first and second comparator circuits are high,
- a second flip-flop connected between said AND gate and said first and second circuit means reversing the direction of said first or second motors each time said second flip-flop changes states.

3. A system according to claim 2 further comprising,
a third comparator circuit connected to said bi-directional coupler means having a high output only when there is forward power in the system,
a fourth comparator circuit connected to said first sample and hold circuit and providing a high output only when the voltage held by said first sample and hold circuit is above a predetermined value below which impedance matched is existent,
a turn on circuit connected to said third and fourth comparator circuit and to said pulse generator providing a motor drive pulse to said first and second circuit means each time pulse four occurs only when each of said third and fourth comparator means have a high.

4. A system according to claim 3 further comprising,
feedback circuit means connected between said bi-directional coupler means and said R.F. power source means for maintaining forward power at an externally commanded power set level.

5. A system according to claim 4 further comprising,
an oscillator and preamplifier included in said R.F. power source means,
said feedback circuit further comprising,
a field effect transistor connected between said oscillator and said preamplifier,
a summing amplifier having a summing input, having its output connected to said field effect transistor,
power level regulator means connected in said feedback circuit to apply voltages to said summing input proportional to reflected power, the negative of forward power and a voltage proportional to an externally commanded power set level whereby forward power is continuously maintained at said power set level.

6. A system according to claim 5 further comprising,
a power amplifier disposed between said peamplifier and said bi-directional coupler means,
a d.c. power source connected to said power amplifier for providing energizing power to said amplifier,
power control circuit means connected to said d.c. power supply for controlling power to said power amplifier in accordance with the externally commanded power set level.

7. A system for supplying R.F. power to a load, comprising;
R.F. power source means including an oscillator and a preamplifier,
bi-directional coupler means connecting said R.F. power source means to the load for passing substantially all the power from said R.F. power source to the load and having voltage outputs proportional to forward and reflected power,
feedback circuit means including summing means connected to said R.F. power source means and to said bi-directional coupler means to receive said voltage outputs,
input means providing an input to said summing means representative of the amount of desired R.F. power at the load to maintain power to the load at the power called for by said input means, said summing means comprising,
- a summing point for receiving said voltage outputs and said input representative of desired R.F. load power,
- a field effect transistor connected between said oscillator and said preamplifier and having a control electrode connected to said summing point,
power amplifier means connected between said preamplifier and said bi-directional coupler means,
d.c. power source means,
second means coupled between said d.c. power source means and said power amplifier and to said input means for controlling the amount of d.c. voltage delivered to said power amplifier in accordance with the amount of R.F. power called for by said input means.

8. A system according to claim 7 further comprising,
load match circuit means connected between said bi-directional coupler means and the load including variable means for matching apparent load impedance to a predetermined value.

9. A system according to claim 8 wherein said variable means comprises,
first and second variable capacitors together with an inductance forming a tank circuit.

10. A system according to claim 9 further comprising,
transmission line means connecting said bi-directional coupler means to said load match circuit means,
said first and second variable capacitors being adjustable to cause said apparent load impedance to equal the surge impedance of said transmission line means.

11. A system according to claim 10 wherein said variable capacitors are capable of being manually adjusted.

12. A system according to claim 10 wherein said load match circuit means includes,
first and second reversible stepping motors connected to said first and second variable capacitors, respectively, for varying the capacitance of each.

13. A system according to claim 12 further comprising,
control circuit means connected to receive said output voltages from said bi-directional coupler means proportional to reflected and forward power and connected to said load match circuit means for energizing said first and second motors to vary said first and second capacitors to cause apparent load impedance to automatically match the surge impedance of said transmission line means whereby reflected power is reduced substantially to zero regardless of variations of load impedance.

14. A system according to claim 13 wherein said control circuit means comprises,
first circuit means connected to said first motor for driving said first motor in a first or second direction,
second circuit means connected to said second motor for driving said second motor in a first or second direction,
first logic circuit means connected to said first and second circuit means for driving said first and second motors only in a direction for reducing the voltage from said bi-directional coupler means proportional to said reflected power,
second logic circuit means connected to said first and second circuit means for periodically selecting one of said first and second motors to be energized.

15. A system according to claim 14 further comprising,
a pulse generator providing first, second, third and fourth pulses periodically,
said second logic circuit comprising,
a first flip-flop connected to said first and second circuit means,
counter means connected between said generator means and said first flip-flop causing said flip-flop to change states after said fourth pulse has occurred a predetermined number of times for selecting said first or second motors to be energized in accordance with the state of said first flip-flop.

16. A system according to claim 15 wherein said first logic circuit means comprises,
first sample and hold circuit connected to said bi-directional coupler means and to said pulse generator means for receiving and holding said voltage proportional to reflected power on each occurrence of pulse two,
second sample and hold circuit connected to said first sample and hold circuit and said pulse generator for receiving and storing said voltage proportional to reflected power on each occurrence of pulse one,
a first comparator circuit connected to said first and second sample and hold circuits providing a high output only when voltage held in said first sample and hold circuit is lower than the voltage held in said second sample and hold circuit,
a second comparator circuit connected to said first sample and hold circuit,
voltage divider means connected between said bi-directional coupler means and said second comparator circuit providing a voltage to said second comparator circuit equal to a predetermined percentage of the voltage proportional to forward power, said second comparator having a high only when said voltage from said first sample and hold circuit is less than said voltage from said divider circuit means,
an AND gate connected to receive the outputs from said first and second comparator circuits and to said power generator providing an output each time the third pulse occurs only if the outputs from said first and second comparator circuits are high,
a second flip-flop connected between said AND gate and said first and second circuit means reversing the direction of said first or second motors each time said second flip-flop changes states.

17. A system according to claim 16 further comprising,
a third comparator circuit connected to said bi-directional coupler means having a high output only when there is forward power in the system,
a fourth comparator circuit connected to said first sample and hold circuit and providing a high output only when the voltage held by said first sample and hold circuit is above a predetermined value below which an impedance match is existent,
a turn on circuit connected to said third and fourth comparator circuit and to said pulse generator providing a motor drive pulse to said first and second circuit means each time pulse four occurs only when each of said third and fourth comparator means have a high.

* * * * *